United States Patent
Chen

(10) Patent No.: US 9,380,706 B2
(45) Date of Patent: Jun. 28, 2016

(54) METHOD OF MANUFACTURING A SUBSTRATE STRIP WITH WIRING

(75) Inventor: Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 112 days.

(21) Appl. No.: 13/111,000

(22) Filed: May 19, 2011

(65) Prior Publication Data

US 2011/0303442 A1     Dec. 15, 2011

(30) Foreign Application Priority Data

Jun. 11, 2010   (TW) ................................ 99119147 A

(51) Int. Cl.
| | | |
|---|---|---|
| *H05K 3/36* | (2006.01) | |
| *H05K 3/00* | (2006.01) | |
| *H01L 21/48* | (2006.01) | |
| *H01L 23/00* | (2006.01) | |

(52) U.S. Cl.
CPC ............ *H05K 3/0058* (2013.01); *H01L 21/481* (2013.01); *H01L 24/97* (2013.01); *H05K 3/0097* (2013.01); *H01L 24/16* (2013.01); *H01L 24/48* (2013.01); *H01L 24/81* (2013.01); *H01L 24/85* (2013.01); *H01L 2223/54426* (2013.01); *H01L 2224/16225* (2013.01); *H01L 2224/48227* (2013.01); *H01L 2224/81132* (2013.01); *H01L 2224/85132* (2013.01); *H01L 2224/97* (2013.01); *Y10T 29/49128* (2015.01)

(58) Field of Classification Search
CPC ..... H01L 24/93; H05K 3/0097; H05K 3/0058
USPC .................... 29/831, 832, 833, 834, 835, 829
See application file for complete search history.

(56) References Cited

U.S. PATENT DOCUMENTS

| | | | | | |
|---|---|---|---|---|---|
| 4,702,785 | A | * | 10/1987 | Burger ................ | B32B 38/1841 156/307.7 |
| 5,057,461 | A | * | 10/1991 | Fritz ................... | H01L 21/6835 228/175 |
| 5,514,524 | A | * | 5/1996 | Ohnishi ................ | B41J 2/3356 29/611 |
| 5,732,465 | A | * | 3/1998 | Tokita ................... | H01L 21/565 206/707 |
| 5,960,961 | A | * | 10/1999 | Gutentag ........... | H05K 13/0084 206/714 |
| 6,214,644 | B1 | * | 4/2001 | Glenn .................. | B81B 7/0077 257/E21.503 |
| 6,313,526 | B1 | * | 11/2001 | Nakamura .......... | H01L 21/4821 206/714 |
| 6,413,150 | B1 | * | 7/2002 | Blair ...................... | B82D 5/029 451/12 |

(Continued)

FOREIGN PATENT DOCUMENTS

| | | |
|---|---|---|
| CN | 1841688 A | 10/2006 |
| CN | 101077962 | 11/2007 |

(Continued)

*Primary Examiner* — Peter DungBa Vo
*Assistant Examiner* — Kaying Kue
(74) *Attorney, Agent, or Firm* — Rosenberg, Klein & Lee

(57) ABSTRACT

A substrate strip with wiring is provided. The substrate strip includes a plurality of wiring blocks, a carrying substrate, and an adhesive layer. Each of the wiring blocks includes at least one wiring board unit, and each of the wiring board unit includes an insulating layer and a wiring layer disposed on the insulating layer. The carrying substrate has a carrying surface. The adhesive layer is disposed between the carrying surface and the wiring layers, and adheres to the wiring blocks and the carrying substrate. When the adhesive layer is separated from the wiring blocks, the wiring layers are kept on the insulating layers. Further, a manufacturing method for the substrate is provided.

5 Claims, 5 Drawing Sheets

(56) References Cited

U.S. PATENT DOCUMENTS

| | | | | |
|---|---|---|---|---|
| 6,465,329 | B1* | 10/2002 | Glenn | H01L 21/67092 257/E21.599 |
| 6,555,417 | B2* | 4/2003 | Spooner | B81C 1/00888 438/113 |
| 6,574,862 | B1 | 6/2003 | Choi et al. | |
| 6,624,003 | B1* | 9/2003 | Rice | B81B 7/007 438/106 |
| 6,740,966 | B2* | 5/2004 | Nakamura | H01L 21/4821 257/668 |
| 6,946,326 | B2* | 9/2005 | Spooner | B81C 1/00888 257/620 |
| 7,222,421 | B2* | 5/2007 | Nakamura | H05K 3/0097 156/248 |
| 7,594,317 | B2* | 9/2009 | Nakamura | H05K 3/205 29/825 |
| 7,597,929 | B2* | 10/2009 | Kyozuka | H05K 3/0058 427/117 |
| 7,923,298 | B2* | 4/2011 | Oliver | H01L 27/14618 438/114 |
| 8,176,627 | B2* | 5/2012 | Kobayashi | H01L 21/4857 156/248 |
| 8,207,450 | B2* | 6/2012 | An | H01L 21/4857 174/261 |
| 8,209,860 | B2* | 7/2012 | An | H05K 3/4007 29/830 |
| 2001/0008303 | A1* | 7/2001 | Nakamura | H01L 21/4821 257/666 |
| 2002/0096743 | A1* | 7/2002 | Spooner | B81C 1/00888 257/620 |
| 2007/0190691 | A1* | 8/2007 | Humpston | B81C 1/00269 438/113 |
| 2008/0202661 | A1* | 8/2008 | Kobayashi | H01L 21/4857 156/50 |
| 2008/0248231 | A1 | 10/2008 | Daigaku et al. | |
| 2009/0191691 | A1* | 7/2009 | Chen | B23K 26/18 438/462 |

FOREIGN PATENT DOCUMENTS

| | | |
|---|---|---|
| CN | 101676845 | 3/2010 |
| JP | 2002-324969 A | 11/2002 |
| JP | 2006147608 | 6/2006 |
| JP | 2009239307 | 10/2009 |

* cited by examiner

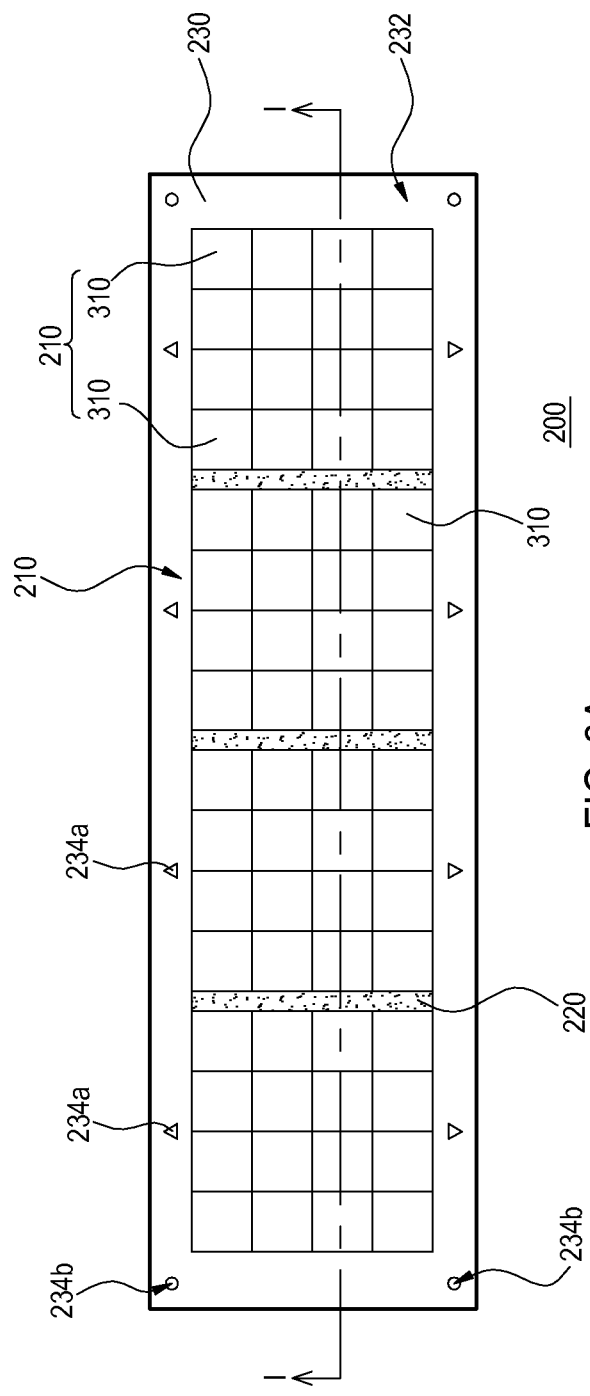
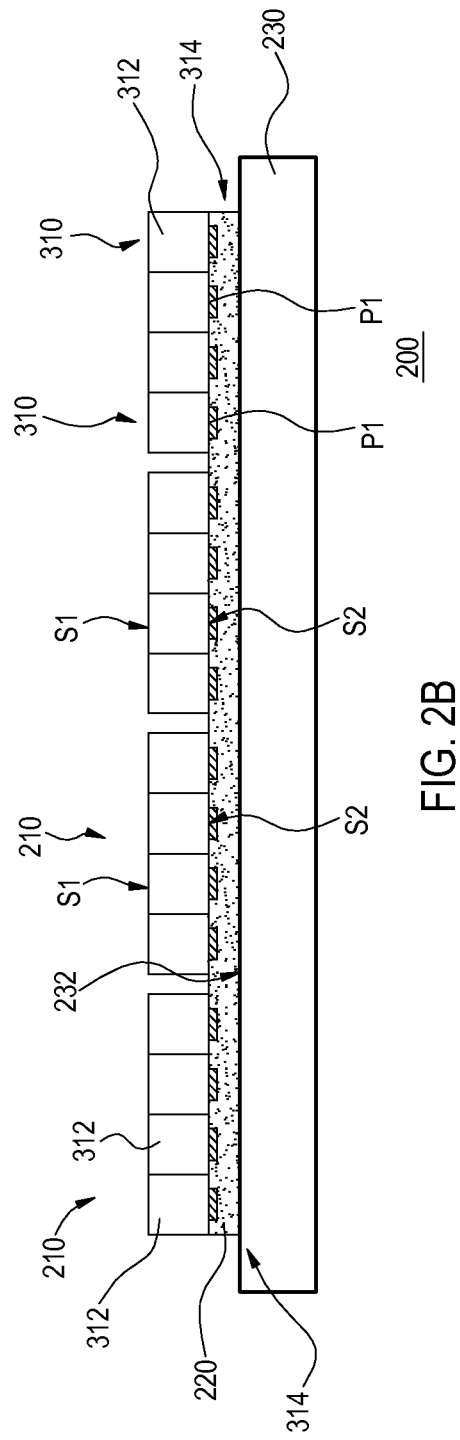
FIG. 2A
FIG. 2B

METHOD OF MANUFACTURING A SUBSTRATE STRIP WITH WIRING

CROSS-REFERENCE TO RELATED APPLICATION

This application claims the benefit of Taiwan Patent Application No. 099119147, filed on Jun. 11, 2010, which is hereby incorporated by reference for all purposes as if fully set forth herein.

BACKGROUND OF THE INVENTION

1. Field of the Invention

The present invention relates to a wiring board and a method of manufacturing the same, and more particularly to a substrate strip with wiring, and a method of manufacturing the same.

2. Brief Description of the Related Art

In the existing wiring board technology, the package carrier used for carrying chips is generally formed by cutting a substrate panel (It is also called "panel") with large area that has been through electrical wiring manufacture procedure. The substrate panel is shown in FIG. 1.

FIG. 1 is a top view illustrating a substrate panel according to prior art. Referring to FIG. 1, the existing substrate panel 100 includes a plurality of substrate strips (These are also called "strips") 110, and each of the substrate strips 110 includes a plurality of wiring blocks 112 and a frame 114 surrounding the plurality of wiring blocks 112. Each of the wiring blocks 112 includes a plurality of package carriers (not shown), and a single wiring block 112 can be cut and separated into the package carriers.

In general, the complete substrate panel 100 will be cut to separate the substrate strips 110 from each other. Then, the substrate strips 110 will be transported to packaging and testing factory. At that time, the substrate strips 110 are not cut, so the wiring blocks 112 and the frame 114 both on the same substrate strip 110 are still combined together.

The packaging and testing factory will mount the chips on the substrate strips 110 and form packaging encapsulation that is capable of covering the chips after receiving the substrate strips 110, thereby protecting the chips and the package carriers, wherein the chips are electrically connected to the substrate strips 110. After that, the substrate strips 110 are cut to separate the package carriers with chips mounted thereon from each other.

SUMMARY OF THE INVENTION

The present invention is directed to a substrate strip with wiring, and a plurality of wiring blocks included in the substrate strip are adhered to a carrying substrate.

The present invention is directed to a manufacturing method for the substrate strip.

The present invention provides a substrate strip with wiring. The substrate strip includes a plurality of wiring blocks, a carrying substrate, and an adhesive layer. Each of the wiring blocks includes at least one wiring board unit (It is also called "unit"), and each of the wiring board unit includes an insulating layer and a wiring layer disposed on the insulating layer. The carrying substrate has a carrying surface. The adhesive layer is disposed between the carrying surface and the wiring layers, and adheres to the wiring blocks and the carrying substrate. When the adhesive layer is separated from the wiring blocks, the wiring layers are kept on the insulating layer.

The present invention also provides a manufacturing method for the substrate strip with wiring. In the manufacturing method, first, a substrate panel is cut to form a plurality of wiring blocks separated from each other. Each of the wiring blocks includes at least one wiring board unit, and each of the wiring board unit includes an insulating layer and a wiring layer disposed on the insulating layer. Next, some wiring blocks are adhered to an adhesive layer, and the adhesive layer is disposed on a carrying substrate and between the wiring blocks and the carrying substrate. When the adhesive layer is separated from the wiring blocks, the wiring layers are kept on the insulating layer.

As the foregoing, the adhesive layer of the substrate strip can adhere to a plurality of wiring blocks, thereby allowing the wiring blocks to be secured on the carrying substrate. It can be seen that the invention can prevent the wiring blocks from detaching from the adhesive layer owing to movement, vibration or shake of the substrate strip.

The details of one or more embodiments are set forth in the accompanying drawings and the description below. Other features will be apparent from the description and drawings, and from the claims.

BRIEF DESCRIPTION OF THE DRAWINGS

The detail structure, the applied principle, the function and the effectiveness of the present invention can be more fully understood with reference to the following description and accompanying drawings, in which:

FIG. 2A is a top view illustrating a substrate strip with wiring according to an embodiment of the present invention;

FIG. 2B is a sectional view taken along line I-I of FIG. 2A;

DETAILED DESCRIPTION OF THE PREFERRED EMBODIMENTS

Figure 1:
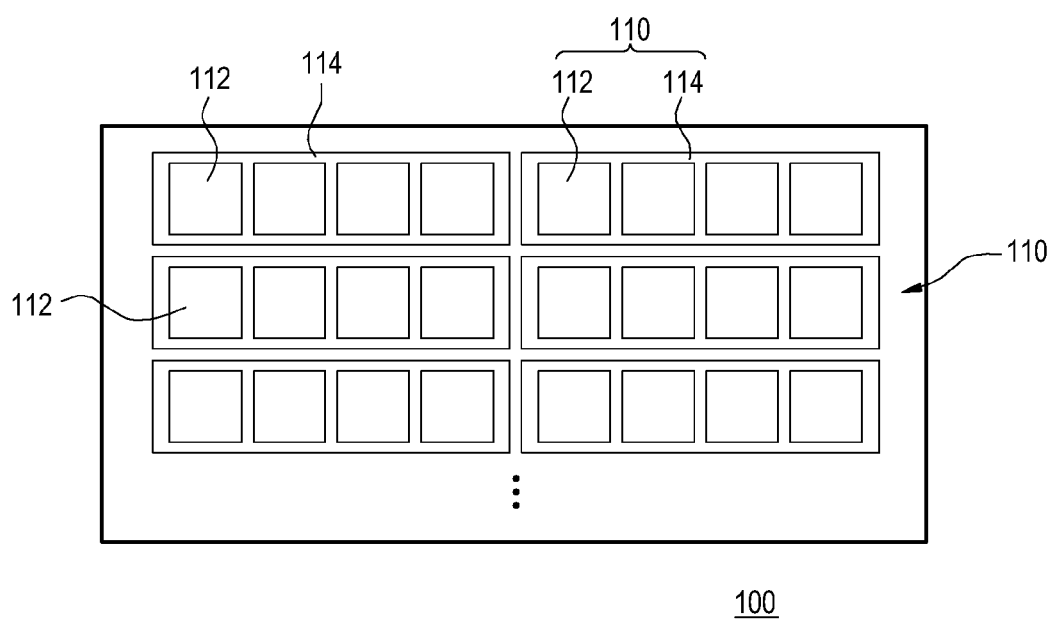
FIG. 1 is a top view illustrating a substrate panel according to prior art.

FIG. 2A is a top view illustrating a substrate strip with wiring according to an embodiment of the present invention, and FIG. 2B is a sectional view taken along line I-I of FIG. 2A. Referring to FIGS. 2A and 2B, a substrate strip 200 of the embodiment includes a plurality of wiring blocks 210, an adhesive layer 220 and a carrying substrate 230. The adhesive layer 220 is adhered between the wiring blocks 210 and the carrying substrate 230. The wiring blocks 210 may be arranged in a line on the adhesive layer 220.

Each of the wiring blocks 210 includes a plurality of wiring board unit 310, and in a same wiring block 210, the wiring board units 310 may be arranged in an array, as shown in FIG. 2A. However, in other embodiments, at least one of the wiring blocks 210 may include only one wiring board unit 310. In other words, one wiring block 210 may be one wiring board unit 310. Hence, the number of the wiring board units 310 included in each of the wiring blocks 210 shown in FIG. 2A is only taken for an example and does not limit the invention.

The wiring board unit 310 is substantially a wiring board. The wiring board unit 310 may be a single-side wiring board, a double-side wiring board, or a multi-layer wiring board in term of structure. The wiring board unit 310 may be a package carrier or a wiring board in term of function. The package carrier can directly carry a chip, and the wiring board can carry the package carrier.

In detail, each of the wiring board units 310 includes an insulating layer 312 and a wiring layer 314 disposed on the insulating layer 312. The insulating layer 312 has an upper surface S1 and a lower surface S2 opposite to the upper surface S1. The wiring layer 314 is located at the lower surface S2. Each of the wiring layers 314 includes at least one trace (not shown) and at least one pad P1. The pad P1 may be used to be connected to a solder bulk such as a solder ball.

In the embodiment, besides the wiring layer 314, each of the wiring board units 310 may further include another wiring layer (not shown) disposed at the upper surface S1. The wiring layer (not shown) includes at least one trace and at least one chip pad. The chip pad may be used to be connected to a chip. In this case, the chip may be electrically connected to the wiring board unit 310 through the chip pad.

The carrying substrate 230 has a carrying surface 232, and the adhesive layer 220 is disposed between the carrying surface 232 and the wiring layers 314, and adhering to the wiring blocks 210 and the carrying substrate 230. When the wiring board unit 310 is a double-side wiring board or a multi-layer wiring board, the adhesive layer 220 will adhere to the wiring layers 314 and the lower surface S2 of the insulating layer 312. When the wiring board unit 310 is a single-side wiring board, the adhesive layer 220 may only adhere to the upper surface S1 of the insulating layer 312 without contacting any wiring layers (such as the wiring layer 314).

By the adhesion of the adhesive layer 220 to both the wiring blocks 210 and the carrying substrate 230, the wiring blocks 210 can be secured on the carrying substrate 230. Therefore, it can prevent the wiring blocks from detaching from the adhesive layer owing to movement, vibration or shake of the substrate strip.

Moreover, since the wiring blocks 210 are secured on the carrying substrate 230 by the adhesive layer 220, the carrying substrate 230 can support the wiring blocks 210 and enhance the structure of the wiring blocks 210. In this case, when mounting chips, even if the wiring block 210 is a thin-type wiring board with a thickness smaller than 0.15 mm, the carrying substrate 230 can still enhance the structure of the wiring blocks 210 and prevent the wiring blocks 210 from being crushed or punctured by the machine, thereby increasing the yield of the wiring board.

Although the adhesive layer 220 can adhere to the wiring blocks 210, the wiring blocks 210 can still be separated from the adhesive layer 220. The wiring blocks 210 may be separated from the adhesive layer 220 by external force. For instance, the wiring blocks 210 may be separated from the adhesive layer 220 by the external force pulling. When the adhesive layer 220 is separated from the wiring blocks 210, the wiring layer 314 will be kept on the insulating layer 312 and will not be damaged by the adhesive layer 220. That is, the adhesion force between the adhesive layer 220 and the wiring blocks 210 is smaller than the adhesion force between the wiring layer 314 and the insulating layer 312.

In detail, in the embodiment, the adhesion force between the adhesive layer 220 and the wiring blocks 210 may be smaller than 10 N/cm². In a preferred embodiment, the adhesion force between the adhesive layer 220 and the wiring blocks 210 may be smaller (or much smaller) than 6 N/cm². Thus, it allows the wiring blocks 210 to be removed from the adhesive layer 220 bare-handedly to ensure that the adhesive layer 220 will not damage the wiring layer 314. Further, when the adhesive layer 220 is separated from the wiring blocks 210, the adhesive layer 220 may not remain on the wiring blocks 210 to keep the wiring layer 314 and the lower surface S2 of the insulating layer 312 clean.

The adhesive layer 220 may be made of polymeric material such as silicone, rubber, polydimethylsiloxane (PDMS), polymethylmethacrylate (PMMA. i.e. acrylic), or resin. The adhesive layer 220 may be a pressure-sensitive adhesive such as a rubber pressure-sensitive adhesive, an acrylic (PDMS) pressure-sensitive adhesive, or a silicone pressure-sensitive adhesive. The pressure-sensitive adhesive can generate the adhesion under pressure.

Besides, the heat-tolerance temperature of the adhesive layer 220 is between 150° C. to 270° C., wherein the heat-tolerance temperature refers to the highest temperature under which the adhesive layer 220 will not be melted or vaporized, or will not deteriorate (such as hardening). Therefore, when a plurality of chips are mounted on the substrate strip 110 and for instance a wire bonding or a flip chip packaging is performed, the overall adhesion force of the adhesive layer 220 toward the wiring blocks 210 will not change, thereby allowing the wiring blocks 210 to be fully removed from the adhesive layer 220.

It is noted that the carrying substrate 230 may include a plurality of positioning marks 234a, 234b located on the carrying surface 232. The adhesive layer 220 and the wiring blocks 210 expose the positioning marks 234a and 234b. When a machine mounts a plurality of chips on the substrate strip 110, the positioning marks 234a, 234b will help the machine position the substrate strip 110 to make sure that each of the chips is mounted at the correct position.

In the embodiment, the positioning marks may be of different kinds. In the embodiment shown in FIG. 2A, the positioning mark 234a may be a positioning pattern, and the positioning mark 234b may be a positioning hole. The positioning mark 234a may be formed by photolithography and etching, and the positioning mark 234b may be formed by mechanical drilling. In addition, in other embodiments, the carrying substrate 230 may include only a plurality of positioning marks 234a (i.e. positioning patterns) or a plurality of positioning marks 234b (i.e. positioning holes).

Further, although the positioning marks 234a, 234b shown in FIG. 2A are plural, the carrying substrate 230 may include only one positioning mark in other embodiments. For instance, the carrying substrate 230 may include only one positioning mark 234a (i.e. positioning pattern) or only one positioning mark 234b (i.e. positioning hole). Therefore, the positioning marks 234a, 234b shown in FIG. 2A are only taken for an example and do not limit the invention.

The foregoing descriptions focus on the structure of the substrate strip 200. Hereinafter, the manufacturing method of the same will be described in detail with reference to FIGS. 3A, 3B and 4.

Figure 3A:
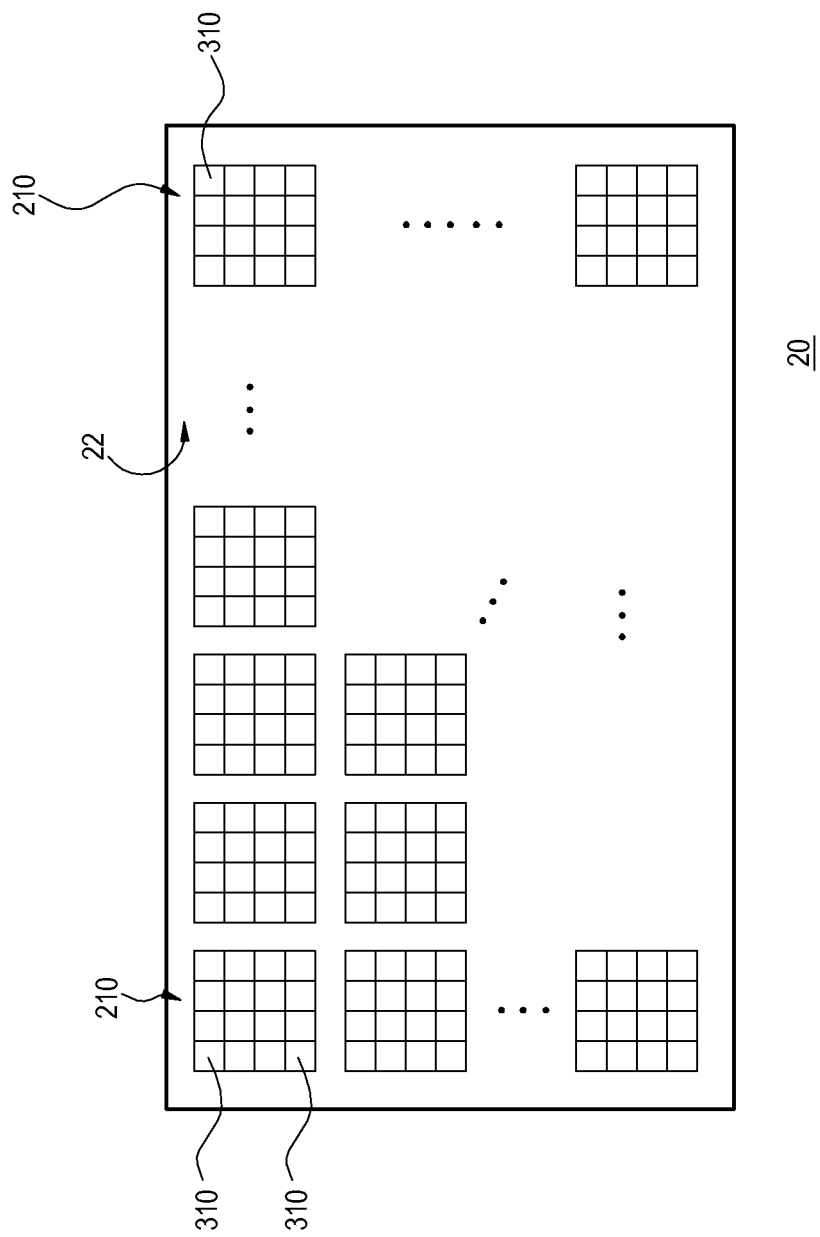
FIG. 3A is a top view illustrating a substrate panel with a plurality of wiring blocks of FIG. 2A.

FIG. 3A is a top view illustrating a substrate panel with a plurality of wiring blocks of FIG. 2A. Referring to FIG. 3A, in the manufacturing method of the substrate strip 200, first, a substrate panel 20 is cut to form a plurality of wiring blocks 210 separated from each other. Each of the wiring blocks 210 includes at least one wiring board unit 310. Unlike the substrate panel 100 of the prior art (as shown in FIG. 1) that the wiring blocks are formed by cutting other substrate strips, the wiring blocks 210 of the embodiment are formed by directly cutting the substrate panel 20.

Different from the substrate panel 100 of the prior art, a surface 22 of the substrate panel 20 only shows a plurality of wiring blocks 210 but does not present any regions representing substrate strip. In other words, the substrate panel 20 will not be cut into a plurality of substrate strips. Hence, the wiring blocks 210 may be arranged on the surface 22 close together, thereby allowing the substrate panel 20 to be divided into more wiring blocks 210 and making full use of the substrate panel 100.

Figure 3B:
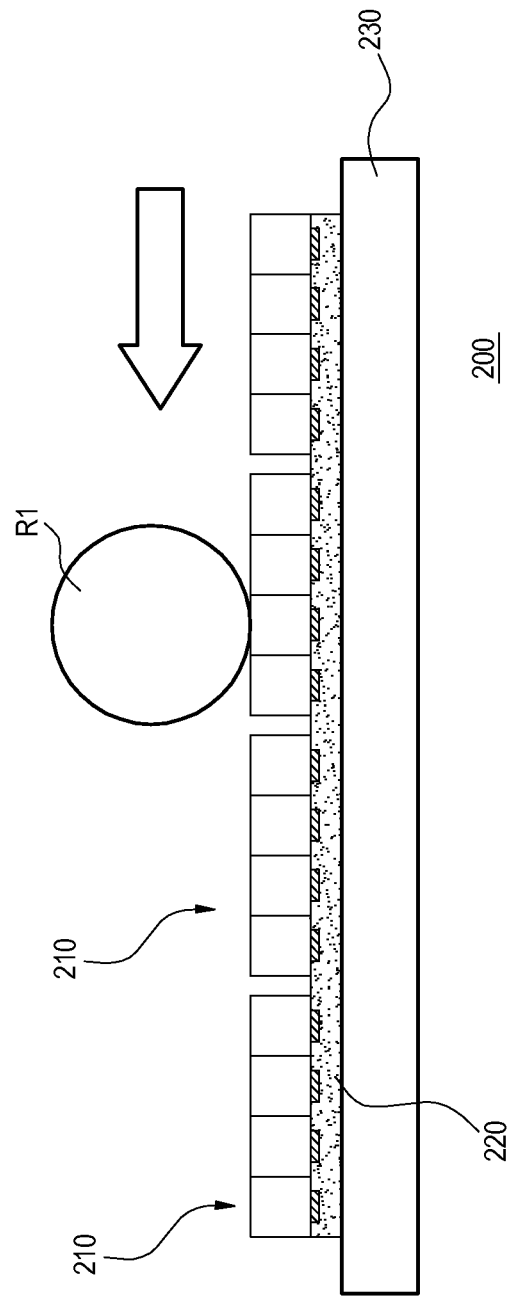
FIG. 3B is a sectional view of an adhesive layer adhering to the wiring blocks.

Referring to FIG. 3B, after cutting the substrate panel 20, the adhesive layer 220 adheres some wiring blocks 210. The adhesive layer 220 is disposed on the carrying substrate 230 and between the wiring blocks 210 and the carrying substrate 230. So far, a substrate strip 200 is basically complete. When adhering the wiring blocks 210 to the adhesive layer 220, a roller R1 may be used to roll on the wiring blocks 210 to allow that the adhesive layer 220 can completely adhere to the wiring blocks 210, thereby preventing the wiring blocks 210 from detaching from the adhesive layer 220 owing to movement, vibration or shake of the substrate strip 200.

Although the rolling of the roller R1 can make the adhesive layer 220 completely adhere to the wiring blocks 210, the wiring blocks 210 may still be separated from the adhesive layer 220 by external force, and the wiring layer 314 is kept on the insulating layer 312 without damaged by the adhesive layer 220. Furthermore, the wiring blocks 210 may be removed from the adhesive layer 220 bare-handedly. After the adhesive layer 220 is separated from the wiring blocks 210, the adhesive layer 220 may not remain on the wiring blocks 210.

In addition, before adhering to the wiring blocks 210, all of the wiring blocks 210 in the substrate panel 20 may be tested in order to determine the normal wiring blocks 210 and abnormal wiring blocks 210 according to the number of acceptable wiring board units 310 in each wiring blocks 210. After that, all normal wiring blocks 210 are adhered to the adhesive layer 220 as far as possible to reduce defect rate of the substrate strip 200 and increase the acceptance of packaging and testing factories towards the substrate strip 200.

Figure 4:
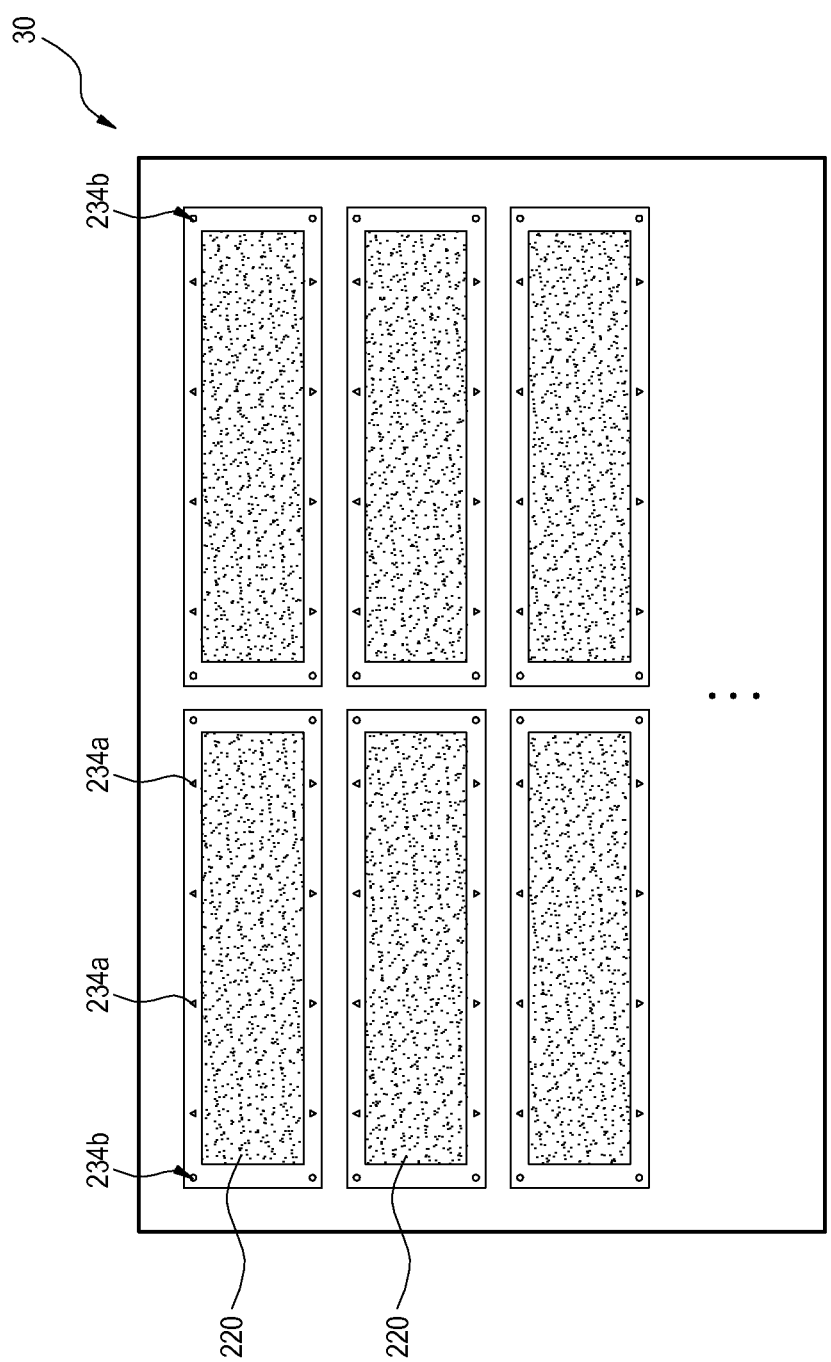
FIG. 4 is a top view illustrating a panel used to form a carrying substrate of FIG. 2A.

FIG. 4 is a top view illustrating a panel used to form a carrying substrate of FIG. 2A. Referring to FIG. 4, in the embodiment, the carrying substrate 230 may be formed by cutting a panel 30. The panel 30 may be metal, ceramic, or composite material panel. The metal panel may include a multi-layer structure, such as sequentially stacking copper, aluminum, and copper layers. The composite material panel may be bismaleimide-triazine resin (BT resin), fiberglass reinforced epoxy resin (FR4), or copper clad Laminate (CCL).

A plurality of adhesive layers 220 may be coated on the panel 30 and a plurality of positioning marks 234a, 2341) may be formed on the panel 30 before the panel 30 cut. The adhesive layers 220 may be coated by spreading, printing, or spraying method. The positioning mark 23411 is a positioning pattern formed by photolithography and etching, and the positioning mark 234!) is a positioning hole formed by mechanical drilling.

It is noted that in other embodiments, only one kind of the positioning marks are formed on the panel 30. For instance, only the positioning marks 234a (positioning patterns) or the positioning marks 234b (positioning holes) are formed on the substrate panel 30. Therefore, the positioning marks 234a, 234b) shown in FIG. 4 are only taken for an example and do not limit the invention.

Based on the foregoing, in the substrate strip of the present invention, the wiring blocks may be secured on the carrying substrate by the adhesion of the adhesive layer. Thus, the invention can prevent the wiring blocks from detaching from the adhesive layer owing to movement, vibration or shake of the substrate strip during transportation, thereby reducing the wiring blocks falling.

Furthermore, since the wiring blocks are secured on the carrying substrate, the carrying substrate can support the wiring blocks and enhance the structure of the wiring blocks. In this case, when mounting chips, even if the wiring block is a thin-type wiring board with a thickness smaller than 0.15 mm, the carrying substrate can enhance the structure of the wiring blocks and prevent the wiring blocks from crushed or punctured by the machine, thereby increasing the yield of the wiring board.

Moreover, in the embodiment, the wiring blocks may be formed by directly cutting a substrate panel, and the surface of the substrate panel may only shows a plurality of wiring blocks but not any regions representing substrate strip. In other words, the substrate panel will not be cut into a plurality of substrate strips. Therefore, compared with prior art, the invention has advantage over the prior art about cutting more wiring blocks from the substrate panel. Thus, the invention is advantageous for mass production of wiring board units and increasing the production capacity of the wiring board.

In addition, before adhering the wiring blocks, all the wiring blocks of the substrate panel may be tested in order to determine the normal wiring blocks and abnormal wiring blocks according to the number of acceptable wiring board units in each of the wiring blocks. After that, adhere all normal wiring blocks to the adhesive layer to reduce defect rate of the substrate strip and increase the acceptance of the packaging and testing factory towards the substrate strip.

Although the preferred embodiments of the present invention are disclosed as the above, but the embodiments are not intended to limit the scope of the present invention, and those skilled in the art can may amendments and improvements without departing the spirit and scope of the present invention, which still fall within the protection scope of the present invention.

What is claimed is:

1. A manufacturing method for a substrate strip with a wiring, comprising:
   cutting a substrate panel to form a plurality of separated wiring blocks, wherein each of the wiring blocks comprises at least one wiring board unit, and each of the wiring board units comprises an insulating layer and a wiring layer disposed on the insulating layer;
   testing the wiring blocks to determine whether the wiring blocks are normal or abnormal;
   establishing an adhesive layer on a carrying substrate, the adhesive layer having a composition that generates an stronger adhesion force with respect to the carrying substrate than with respect to the insulating layer; and
   after the step of testing the wiring blocks, selectively disposing the normal wiring blocks on the adhesive layer, wherein the adhesive layer is arranged between the disposed normal wiring blocks and the carrying substrate, wherein the adhesive layer adheres to and directly contacts the wiring layer of each of the normal wiring blocks so that the wiring layer is embedded in the adhesive layer and when the adhesive layer is separated from the normal wiring blocks, the adhesive layer is maintained in contact with on the carrying substrate.

2. The manufacturing method according to claim 1, wherein the adhesive layer does not remain on the selectively disposed normal wiring blocks thereon when the adhesive layer is separated therefrom.

3. The manufacturing method according to claim 1, wherein the carrying substrate is formed by cutting a panel.

4. The manufacturing method according to claim 3, wherein a plurality of positioning marks are formed on the panel before cutting the panel.

5. The manufacturing method according to claim 3, wherein a plurality of adhesive layers is being coated on the panel before cutting the panel.

\* \* \* \* \*